United States Patent
Sjöland

(10) Patent No.: US 7,957,712 B2
(45) Date of Patent: Jun. 7, 2011

(54) DOUBLE-LINC SWITCHED-MODE TRANSMITTER

(75) Inventor: Henrik Sjöland, Löddeköpinge (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 530 days.

(21) Appl. No.: 12/139,813

(22) Filed: Jun. 16, 2008

(65) Prior Publication Data
US 2009/0311980 A1 Dec. 17, 2009

(51) Int. Cl.
H04B 1/04 (2006.01)

(52) U.S. Cl. ............ 455/127.3; 455/127.1; 455/127.2; 455/114.3; 330/124 R; 330/149

(58) Field of Classification Search ............ 455/127.3, 455/127.1, 127.2, 114.3; 330/124 R, 149
See application file for complete search history.

(56) References Cited

U.S. PATENT DOCUMENTS

| | | | |
|---|---|---|---|
| 5,365,187 A * | 11/1994 | Hornak et al. | 330/10 |
| 5,901,346 A | 5/1999 | Stengel et al. | |
| 5,990,738 A | 11/1999 | Wright et al. | |
| 6,054,896 A | 4/2000 | Wright et al. | |
| 6,311,046 B1 | 10/2001 | Dent | |
| 6,690,223 B1 | 2/2004 | Wan | |
| 6,737,914 B2 * | 5/2004 | Gu | 330/2 |
| 7,184,723 B2 | 2/2007 | Sorrells et al. | |
| 7,737,778 B2 * | 6/2010 | Saed | 330/149 |
| 7,835,709 B2 * | 11/2010 | Sorrells et al. | 455/127.3 |
| 2004/0239429 A1 | 12/2004 | Kermalli | |
| 2007/0202819 A1 | 8/2007 | Sorrells et al. | |
| 2007/0254622 A1 | 11/2007 | Matsuura et al. | |
| 2008/0019456 A1 | 1/2008 | Chen et al. | |

FOREIGN PATENT DOCUMENTS

| | | |
|---|---|---|
| JP | 2006314087 A | 11/2006 |
| WO | 02/060072 A2 | 8/2002 |
| WO | 2007/029119 | 3/2007 |
| WO | 2007/123449 | 11/2007 |

OTHER PUBLICATIONS

Hegazi, G. et al. "Improved LINC Power Transmission Using a Quadrature Outphasing Technique." 2005 IEEE MTT-S International Microwave Symposium Digest, Jun. 12-17, 2005, pp. 1923-1926.

(Continued)

*Primary Examiner* — Sanh D Phu
(74) *Attorney, Agent, or Firm* — Coats & Bennett, P.L.L.C.

(57) ABSTRACT

Disclosed herein are methods and apparatus for processing an input information signal having varying amplitude and phase to obtain an amplified output signal having the same amplitude and phase variation. In an exemplary method, an input information signal is decomposed into two pairs of constant-envelope component signals such that the vector sum of the first pair is orthogonal to the vector sum of the second pair, for desired signal amplitudes below a level corresponding to a pre-determined threshold. For desired signal amplitudes above this level, the input information signal is instead decomposed into two pairs of constant-envelope component signals such that the vector sum of the first pair is separated by less than ninety degrees from the vector sum of the second pair. The constant-envelope component signals may be amplified by highly-efficient non-linear amplifier elements and combined to obtain the amplified output signal.

22 Claims, 8 Drawing Sheets

OTHER PUBLICATIONS

Campbell, R. L. "A Novel High Frequency Single-Sideband Transmitter using Constant-Envelope Modulation." 1998 IEEE MTT-S International Microwave Symposium Digest, Jun. 7-12, 1998, vol. 2, pp. 1121-1124.

Abd Elaal, M. et al. "A 2X1 LINC Transceiver for Enhanced Power Transmission in Wireless Systems." Research Letters in Communications (Hindawi Publishing), vol. 2007, Issue 2, Jan. 2007, pp. 1-4.

Helaoui, M. et al. "A New-Mode-Multiplexing LINC Architecture to Boost the Efficiency of WiMAX Up-Link Transmitters." IEEE Transactions on Microwave Theory and Techniques, vol. 55, No. 2, Feb. 2007, pp. 248-253.

* cited by examiner

US 7,957,712 B2

DOUBLE-LINC SWITCHED-MODE TRANSMITTER

TECHNICAL FIELD

The present invention generally relates to wireless communications, and particularly relates to high-efficiency power amplifier circuits for wireless transmitters.

BACKGROUND

A major consideration in the design of transmitters for wireless devices is the efficiency of the power amplifiers and related circuitry. High efficiency is especially important in portable devices, as transmitter power consumption is typically a major determinant of a device's battery life between charges. Recent trends in mobile wireless communication systems are placing higher demands on power amplifier performance. In particular, data rates supported by wireless systems continue to climb; these higher data rates are enabled by more complex modulation schemes and tighter control of interference from wireless transmitters. These complex modulation schemes and interference limitations make high operating efficiency more difficult to achieve.

Conventional power amplifiers, such as class-B amplifiers, perform with maximum efficiency only at power levels at or near maximum saturated output power levels. However, operation at these levels generally causes high nonlinear distortion, intermodulation products, and harmonics. Nonlinear power amplifier performance is particularly problematic for radio signals with an amplitude modulation; for this reason many early wireless systems were based on constant-envelope modulation schemes such as Frequency Modulation (FM), Frequency-Shift keying (FSK), and Gaussian Minimum Shift Keying (GMSK). However, today's high data-rate systems employ more complex modulation schemes (e.g., the Single-Carrier Frequency Division Multiple Access scheme specified by the $3^{rd}$-Generation Partnership Project, or 3GPP, in their Long-Term Evolution initiative), where information is conveyed in both amplitude and phase/frequency components of the modulated signal.

Transmitter circuits may generally employ either a linear architecture or a polar architecture. In a linear-architecture transmitter circuit, a radio frequency signal modulated in both amplitude and phase is amplified directly. Signal distortion is generally reduced to acceptable levels by operating at output signal levels significantly below the saturated output power level, although various techniques such as signal pre-distortion may also be employed to improve the linearity of the amplifier circuit.

Polar transmitter architectures offer the potential of higher efficiencies. In a polar transmitter, the phase modulation component of the signal to be amplified is separated from the amplitude component. Various configurations of polar transmitter circuits have been developed including the Envelope Elimination and Restoration (EER) and Envelope Tracking (ET) amplifier circuits, Pulse-width Modulation (PWM) amplifier circuits, and amplifier circuits employing so-called Linear Amplification with Non-linear Components, or LINC. Each of these systems relies on a transformation of an input information signal from a Cartesian coordinate representation (e.g., a representation based on in-Phase, I, and quadrature, Q, components) to a polar representation (i.e., amplitude and phase). This approach allows the use of non-linear amplifier components operated at higher efficiencies over a range of output power levels—for example, amplifier elements operated in class-D mode may be used in PWM amplifiers.

However, the transformation of the information signal to a polar representation can result in a large expansion of the bandwidth required to process the amplitude and phase components of the signal. This bandwidth expansion is especially severe in cases where the modulating signal passes close to the origin of the I-Q plane, since the phase component of the signal then experiences a very rapid transition. The corresponding amplitude component in that region of the signal will have a narrow V-shaped notch. Capturing the transition accurately requires a wide bandwidth; if the bandwidth is limited, undesired signals are produced out of band, potentially exceeding the allowed amount of emissions. In some cases, the required bandwidth can be more than ten times that of the information signal to be transmitted. This increased bandwidth corresponds to increased power dissipation in the transmitter chain; in some cases the total transmitter efficiency might not be much better in a polar transmitter circuit than in a linear one.

This bandwidth expansion can cause several other problems. For instance, in an EER amplifier circuit, amplitude variation is typically handled by a DC-DC converter circuit that modulates the supply voltage of the power amplifier. This circuit must have a very wide bandwidth to avoid spurious emissions. However, the DC-DC converter must also have very small ripple and high efficiency, which are generally more difficult to achieve with a larger bandwidth. Similar problems arise in other polar transmitter architectures.

In the past, linear transmitter architectures have often been preferred for meeting stringent modulation accuracy and spurious emissions requirements. However, although linear transmitter architectures do not suffer from the bandwidth expansion issues discussed above, the efficiency of linear power amplifiers is limited, especially when the input signal level is backed off significantly from the circuit's maximum output power. This limited efficiency means that polar transmitters continue to be of major interest, in spite of the bandwidth expansion problems, since they can support the use of highly efficient switched mode power amplifiers. The bandwidth expansion problem, however, is especially problematic for signals with large modulation depth and wide bandwidth, such as those specified for LTE systems.

SUMMARY

Disclosed herein are methods and apparatus for processing an input information signal having varying amplitude and phase to obtain an amplified output signal having the same, or substantially the same, amplitude and phase variation. Various embodiments of the invention facilitate the use of highly efficient switched-mode power amplifiers in transmitting complex modulated signals, without having to handle internal signals with bandwidths several times that of the modulated signal itself. Certain embodiments of the invention may be especially useful for wide-bandwidth wireless systems with complex modulation schemes, such as the Long-Term Evolution (LTE) system currently under development by the $3^{rd}$-Generation Partnership Project (3GPP).

In general, an input information signal comprising the amplitude and phase variation of the desired output signal may be represented by two vectors, so that the sum of the vectors equals the total signal to be transmitted. At low output signal amplitudes, close to the origin of the I-Q signal plane, the two vectors are aligned to the real and imaginary axes. That is, a regular I-Q representation is used. At high output signal amplitudes, the two vectors are instead aligned to generally point in the same direction as the signal to be transmitted. Because a Cartesian coordinate representation is used close to the origin, the bandwidth expansion is minimized. On the other hand, since both vectors are pointing in the same direction for high output signal amplitudes, maximum output power can be reached.

In some embodiments of the invention, each of the two vectors is further decomposed into a pair of constant-envelope component signals. That is, each vector is split into two vectors of constant length. These constant-length vectors lend themselves well to being amplified in switched mode power amplifiers with high efficiency. In some embodiments the constant-envelope component signals are frequency up-converted and amplified directly by individual amplifier elements. In other embodiments, the up-converted signals are fed, pair-wise, into digital logic configured to convert the signals into two pulse-width modulated (PWM) signals. In these embodiments, only two switched mode power amplifiers are required, one for each PWM signal.

In an exemplary method for processing an input information signal, the input information signal is decomposed into two pairs of constant-envelope component signals such that the vector sum of the first pair of component signals is orthogonal to the vector sum of the second pair of component signals, for desired signal amplitudes below a level corresponding to a pre-determined threshold. For desired signal amplitudes above this level, the input information signal is instead decomposed into two pairs of constant-envelope component signals such that the vector sum of the first pair is separated by less than ninety degrees from the vector sum of the second pair. A plurality of amplifier input signals are generated from the constant-envelope component signals and amplified by separate amplifier elements. The amplified signals are then combined to obtain the output signal. In some embodiments each constant-envelope component signal is upconverted to the output signal carrier frequency and separately amplified; in others, each pair of constant-envelope component signals is used to generate a pulse-width modulated signal for amplification and combining.

In some embodiments of the invention, the vector sum of the constant-envelope component signals is equal, or substantially equal, to the input information signal. In other embodiments, the vector sum may be proportional to the input information signal, and may be at a constant phase offset.

Apparatus for processing information signals according to one or more of the above methods, as well as variations of those methods, are also disclosed herein. Of course, the present invention is not limited to the above features and advantages. Those skilled in the art will recognize additional features and advantages upon reading the following detailed description, and upon viewing the accompanying drawings.

DETAILED DESCRIPTION

Figure 1:
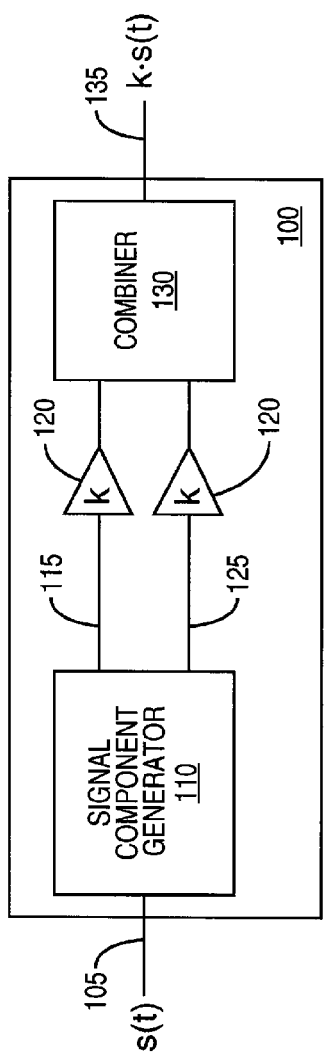
FIG. 1 illustrates a conventional LINC transmitter circuit.

FIG. 1 illustrates a conventional LINC (Linear amplification with Nonlinear Components) amplifier circuit 100. LINC amplifier 100 includes a signal component generator 110, two identical power amplifier stages 120, and a signal combiner 130. In operation, LINC amplifier 100 is supplied with a complex information signal s(t) 105. The input signal 105 may comprise digital samples of a baseband signal carrying the modulation for any modulation scheme. The modulation scheme may include both phase and amplitude modulation components.

Signal component generator 110 decomposes the input signal into two vector components and generates two constant-envelope signals 115 and 125 for amplification by the two amplifiers 120. These two signals are constructed so that their vector sum carries the desired modulation of the output signal, as will be discussed in more detail below. Because these signals have constant amplitudes (i.e., no amplitude modulation component), they may be amplified using non-linear amplifier components, and then combined (vectorially) in combiner 130 to produce the amplified output signal 135. The nonlinear amplifier elements produce distortion products at harmonics of the carrier frequency, but these can be filtered before the signal is transmitted.

Figure 2C:
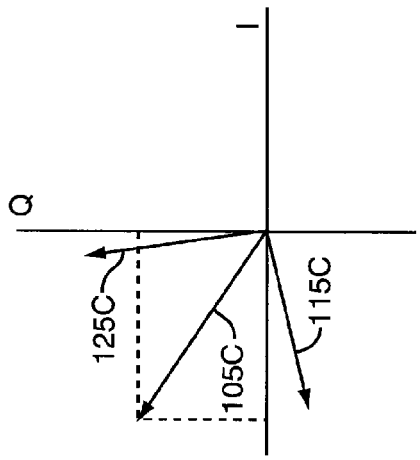
FIGS. 2A, 2B, 2C illustrate the combining of constant-envelope signal vectors to obtain a desired signal amplitude and phase.
Figure 2B:
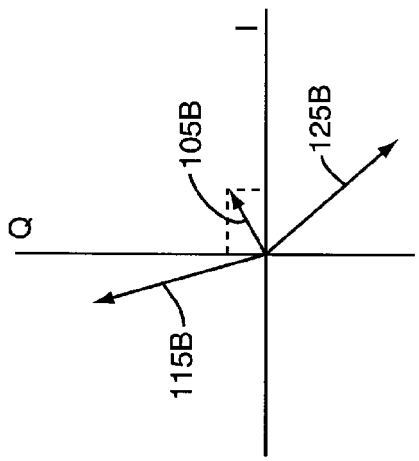
Figure 2A:
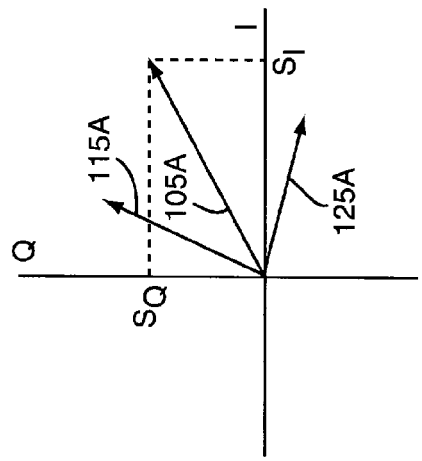

FIGS. 2A, 2B, and 2C illustrate the decomposition of various input information signal samples into constant-envelope signal vectors. For instance, in FIG. 2A, the input information signal 105A is in the first quadrant of the I-Q plane, and has a magnitude somewhat greater than each of the constant-amplitude component vectors 115A and 125A. In contrast, the input information signal sample 105B in FIG. 2B has a magnitude significantly smaller than that of the constant-amplitude component vectors 115B and 125B. As a result, the component vectors 115B and 125B, which have a sum that equals input signal sample 105B, are nearly opposite in phase. Finally, FIG. 2C illustrates the placement of component vectors 115C and 125C such that their vector sum equals an input signal sample 105C in the second quadrant of the I-Q plane (i.e., the I component is negative). Those skilled in the art will thus appreciate that two constant-amplitude vectors may be constructed so that their sum has any desired phase, as well as any desired amplitude between zero and twice the amplitude of the constant-amplitude vector.

As was noted above, the representation of signals in polar form may require significantly more bandwidth than the corresponding representation in Cartesian form (e.g., I-Q representation). In a conventional LINC amplifier circuit, this bandwidth expansion problem is reflected in the construction of the constant-envelope component vectors. This may be seen by re-examining FIGS. 2A-2C. When two constant amplitude signals, such as component vectors 115 and 125 are combined to produce a varying amplitude, the phase of each component vector may vary in opposite directions. Thus, as the input signal moves from sample 105A, pictured in FIG. 2A, to sample 105B, in FIG. 2B, the phases of the component vectors 115 and 125 vary, in opposite directions, to compensate for the amplitude variation in the input signal. When the phase of the input sample also varies (as is the case between FIGS. 2B and 2C), the desired phase variation is added to the phases of each of the component vectors. For one of the vectors, this phase variation may be in addition to the change in phase needed to accommodate input signal amplitude changes. Thus, the phase of one or both of the component vectors may need to vary very rapidly.

This bandwidth expansion problem was previously addressed in U.S. Pat. No. 6,311,046, issued Oct. 30, 2001 to Dent, the entire contents of which are incorporated herein by reference. The Dent patent describes an amplifier circuit in which an input signal of varying amplitude and varying phase is converted into four constant-amplitude signals, each of which is separately amplified and then combined. These four signals are created by first decomposing the signal into its in-phase (I) and quadrature (Q) components, and then creating two pairs of constant-amplitude signals, such that the vector sum of one pair equals the I component and the vector sum of the other equals the Q component. As was explained in the Dent patent, this approach reduces the bandwidth needed to process the component signals. This is because the trajectory of the I or Q components must pass exactly through the origin upon changing sign, at a rate that is limited by the bandwidth of the original input signal. Furthermore, each of the four component vectors is only required to rotate through 180 degrees of phase, rather than through the entire 360 degree phase space.

Although the solution described by Dent solves the bandwidth expansion problem, the four component vectors can never be combined optimally, since they can never have the same phase. For instance, assume that each of the four constant-envelope signals has an amplitude of A. One pair of signals sums to produce the I component of the desired signal. This pair may have the same phase, when directed along the I axis, for a maximum amplitude of 2A. Similarly, the other pair may sum to a maximum amplitude of 2A, when both are directed along the Q axis. However, when all four vectors are added together, the sum is $2\sqrt{2}A$, not 4A. If an output signal aligned to either the I or Q axis is needed, the maximum amplitude is just 2A, as just one of the pairs would then be used. Thus, the amplifiers cannot deliver maximum output power and efficiency.

Figure 3:
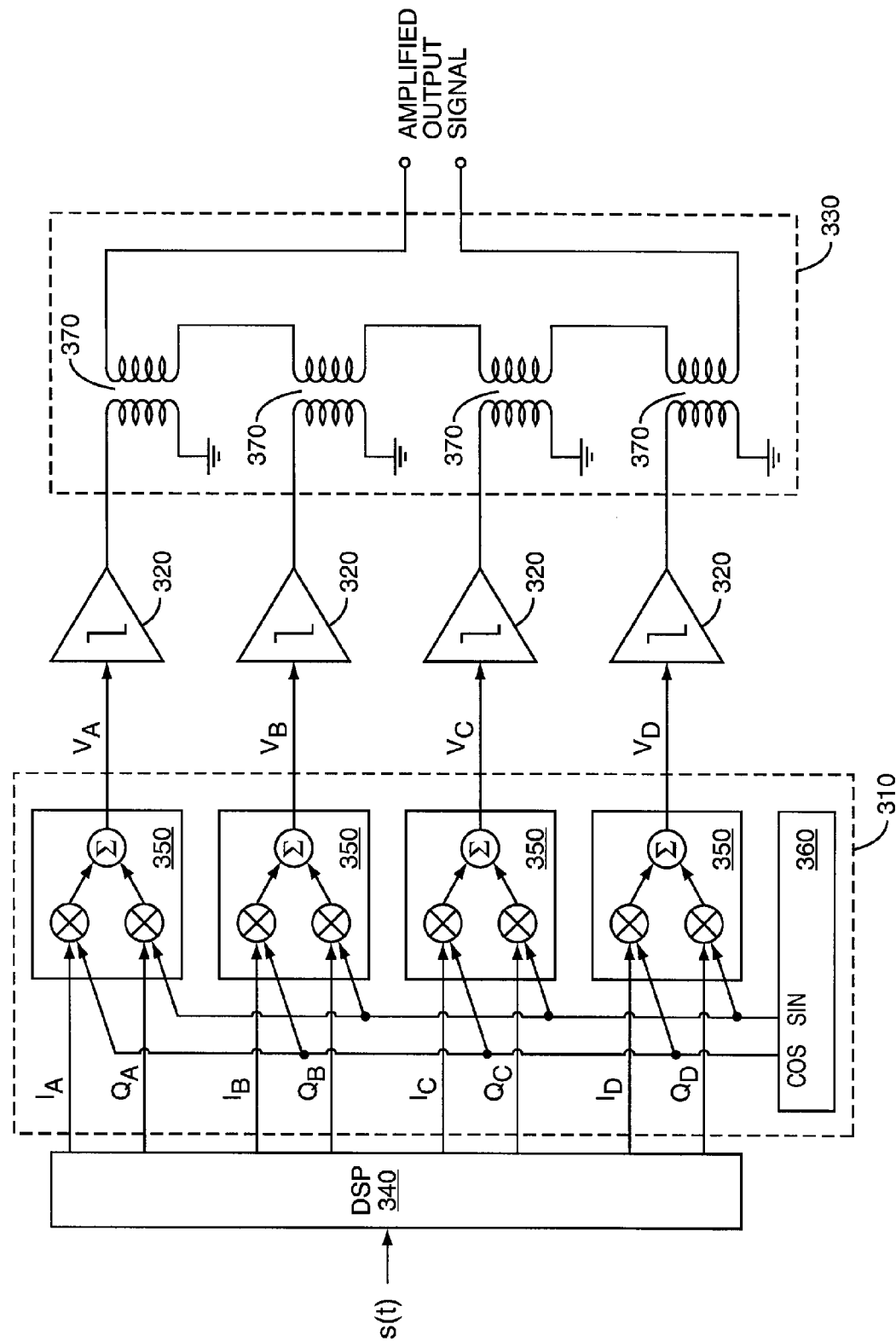
FIG. 3 illustrates an exemplary transmitter circuit according to some embodiments of the invention.

FIG. 3 thus illustrates an exemplary transmitter circuit that addresses the bandwidth expansion problem and also permits operation at peak efficiency when delivering maximum output power. In the transmitter circuit of FIG. 3, an input signal s(t) is also decomposed into four constant-envelope vector components. However, the approach to constructing the vector components varies, depending upon the desired output signal amplitude.

The transmitter circuit of FIG. 3 includes a digital signal processor (DSP) 340, signal generator circuit 310, amplifier elements 320, and combining circuit 330, configured to process an input signal s(t) having varying amplitude and phase to obtain an amplified output signal. DSP 340 is configured to decompose a baseband digital input signal s(t) into four constant-envelope component signals, each of which is represented in FIG. 3 in Cartesian form ($I_4$, $Q_4$, etc.) The constant-envelope component signals are provided to quadrature modulators 350, for upconversion to the desired carrier signal frequency. Local oscillator signals for each of the quadrature modulators 350 are provided by quadrature oscillator 360, which generates an in-phase reference (cos [ωt]) and quadrature reference (sin [ω]). Upconversion yields amplifier input signals $V_A$, $V_B$, $V_C$, $V_D$, which are each amplified by a non-linear amplifier element 320 and combined by combining circuit 330, which in FIG. 3 is pictured as comprising transformer elements 370.

Those skilled in the art will appreciate that each of the individual components in FIG. 3 is well known. DSP 340, for example, may comprise one or more off-the-shelf or custom microprocessors; in some embodiments DSP 340 may comprise one or more processors optimized for signal processing applications. Quadrature modulators 350 and quadrature oscillator 360 are also well known in the art. Those skilled in the art will appreciate that other approaches to generating radio frequency signals are also possible. For instance, the Dent patent incorporated by reference above describes the use of fractional-N frequency synthesizers to generate a phase-modulated radio frequency signal, as well as the use of Direct Digital Synthesizer (DDS) technology. Any other conventional method of producing phase-modulated signals may be substituted for the quadrature modulators 350 and/or quadrature oscillator 360.

Similarly, although combining circuit 330 is pictured in FIG. 3 as comprising several transformer elements 370, those skilled in the art will appreciate that other conventional means for combining several amplified signals may be used. The incorporated Dent patent includes several such alternatives. In one, the output of each power amplifier element is fed through a separate quarter-wavelength transmission line; the quarter-wavelength transmission lines are tied together at the opposite ends. (Lumped-element equivalents of the quarter-wavelength transmission lines may also be used.) In effect, this parallel transmission line approach adds the output currents of the amplifier outputs together, whereas the serial transformer approach pictured in FIG. 3 adds together the output voltages of the amplifiers. Those skilled in the art will appreciate that different combining techniques may necessitate the use of different designs for the amplifier elements.

In various embodiments of the invention, including the transmitter circuit pictured in FIG. 3, the input information signal may be first decomposed into two vectors, so that the sum of the vectors equals the total signal to be transmitted. In various embodiments of the present invention, the two vectors are aligned to the real and imaginary axes when the desired output power is low, i.e., when the input information signal is relatively close to the origin of the I-Q plane. In other words, for input information signal samples corresponding to relatively low output signal amplitudes, a regular I-Q representation of the input signal is used. The I and Q components of the input signal may then each be decomposed into two constant-envelope vector signals suitable for amplification and combining by a LINC amplifier structure; when combined, the four amplified signals yield the desired amplified output signal. The use of this process for signal amplitudes close to the origin minimizes bandwidth expansion.

At higher output amplitudes, however, such as amplitudes close to the maximum output signal amplitude, the input signal is instead decomposed into two vectors that are generally pointing in the same direction as the signal to be transmitted. That is, unlike the low-amplitude scenario, where the input signal is decomposed into quadrature components, input signals corresponding to high output amplitudes are decomposed into two vectors that are separated by less than 90 degrees. Each of these two vectors may also be further decomposed into two constant-envelope vector signals suitable for amplification and combining by a LINC amplifier structure. At high output signal levels, all four vectors may also be pointing in generally the same direction; indeed, at maximum output levels, all four vectors may have the same, or nearly the same, phase. The vectors thus add constructively, allowing the maximum possible output power to be achieved.

Figure 4:
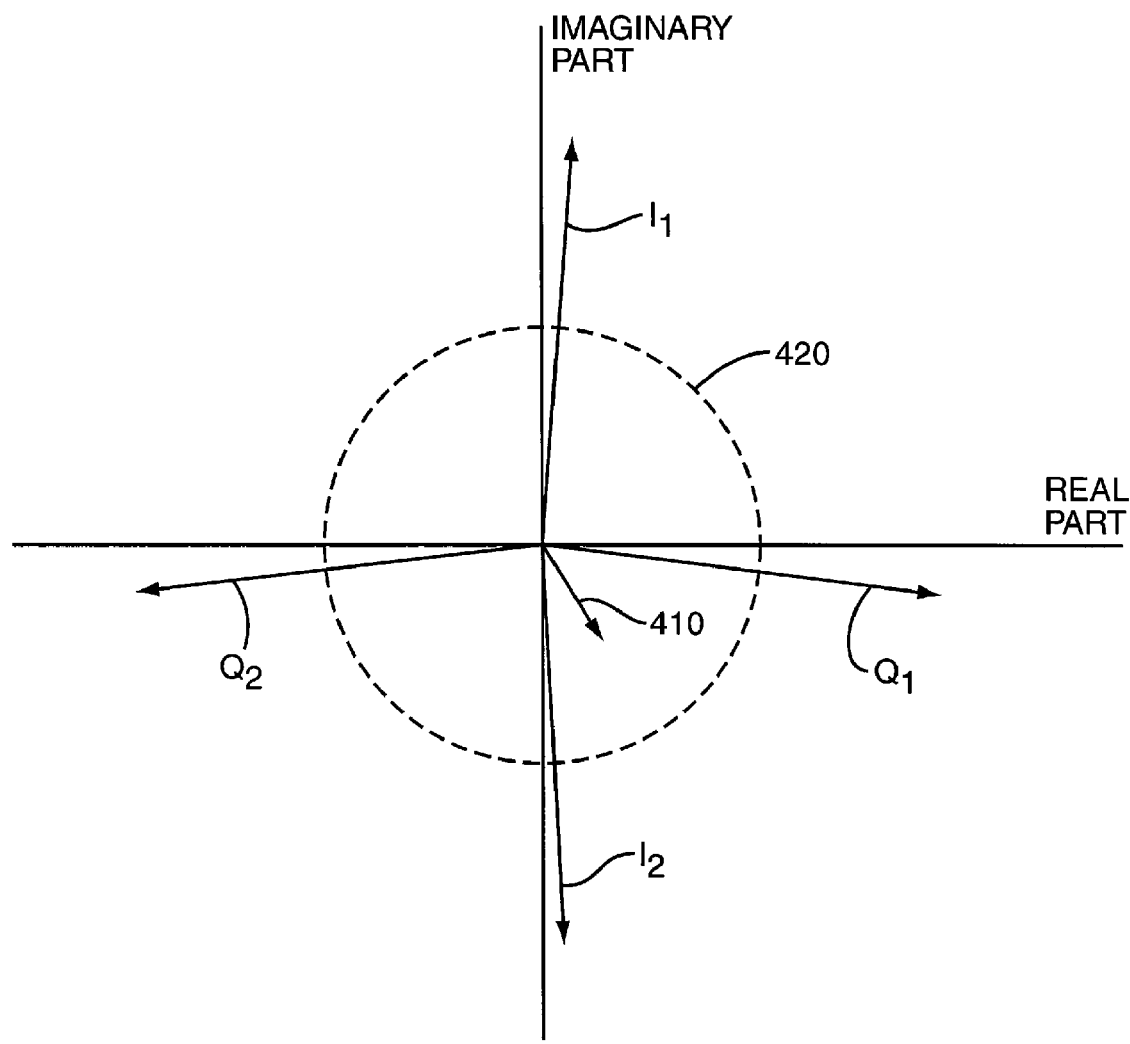
FIG. 4 illustrates the use of two pairs of constant-envelope signal vectors to obtain I and Q components of a desired signal vector.

FIG. 4 illustrates the decomposition of an input information signal into two pairs of constant-envelope component signals for the case where the desired output signal amplitude is relatively low. In FIG. 4, a complex sample of the input information signal is represented by vector 410, which has a positive real part (I component) of magnitude $I_S$ and a negative imaginary part (Q component) with magnitude $Q_S$. The I component is further decomposed into constant-amplitude vectors $I_1$ and $I_2$. The sum of vectors $I_1$ and $I_2$ is a purely real component, with magnitude $I_S$. Similarly, the Q component is further decomposed into constant-amplitude vectors $Q_1$ and $Q_2$. The sum of vectors $Q_1$ and $Q_2$ is a purely imaginary component, with magnitude $Q_S$. The four constant-amplitude vectors added together thus yield the desired input signal, vector 410.

Of course, those skilled in the art will appreciate that in practical implementations, the sum of the four constant-amplitude vectors may only approximate the desired input signal vector 410, due to quantization errors, rounding, and the like. Furthermore, the constant-amplitude vectors may be constructed, in some embodiments, so that their vector sum is proportional to the input information signal. In some embodiments, the vector sum of the constant-amplitude vectors may even be constructed to have a different phase than the input information signal; this is acceptable if this phase offset remains constant over time. Finally, although the constant-amplitude vectors in FIG. 4 each have the same amplitude, those skilled in the art will appreciate that this need not necessarily be the case. ("Constant-amplitude" or "constant-envelope" means that the amplitude of a vector remains the same over a period of time, not that the amplitude of several vectors is identical.) In many embodiments, the constant-amplitude vectors may have identical amplitudes. In such an embodiment, the amplifier elements 320 should preferably have substantially identical gain and phase (delay) characteristics. However, it is possible to construct a transmitter circuit where the constant-amplitude vectors are not equal in amplitude, and are amplified by amplifier elements with differing gain/phase response.

In any event, in some embodiments of the invention, the approach pictured in FIG. 4 is employed only when the desired output signal amplitude is below a pre-determined level, pictured in FIG. 4 at 420. Thus, this approach is applied when the amplitude modulation component of the information signal is near the origin of the I-Q plane, where the bandwidth expansion problem discussed earlier would otherwise be observed. For output signal levels above the pre-determined level, however, a different approach is employed, as pictured in FIG. 5.

Figure 5:
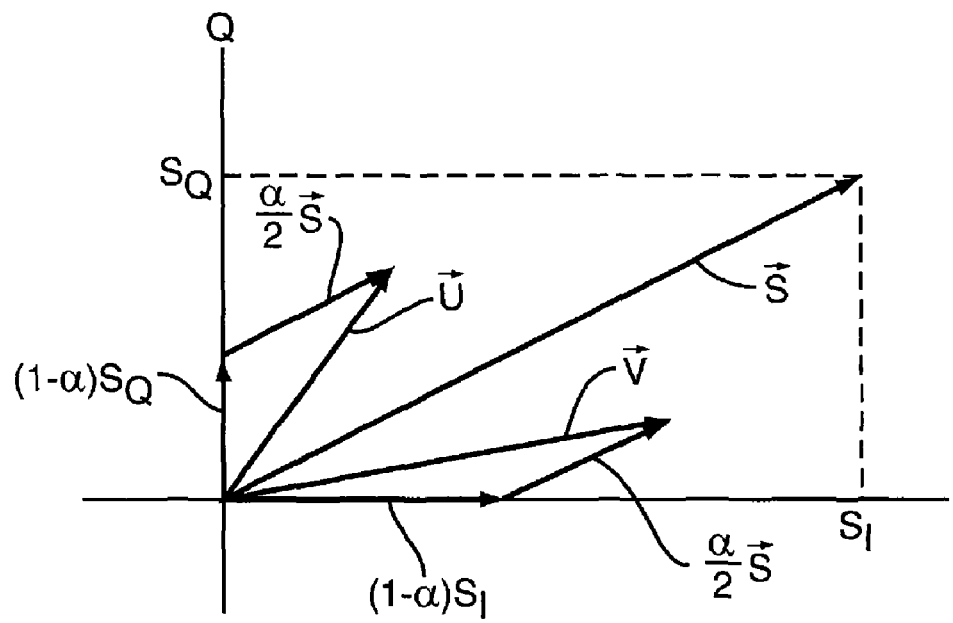
FIG. 5 illustrates the construction of component signal vectors according to some embodiments of the invention.

In FIG. 5, the desired input signal is pictured as vector S. In Cartesian terms, vector S has an I component of $S_I$ and a Q component of $S_Q$. Also illustrated in FIG. 5 are vectors U and V, the sum of which equals S. Vector U can be constructed by adding a scaled version of S to a scaled version of the Q component of S. Thus, as shown in the figure, $$U = (1-\alpha)S_Q(t) + \frac{\alpha}{2}S,$$

where $\alpha$ is a parameter that may take on any value between zero and 1. Similarly, vector V can be constructed by adding a scaled version of S to a scaled version of the I component of S, so that $$V = (1-\alpha)S_I + \frac{\alpha}{2}S.$$

Vectors U and V (which are not constant-envelope vectors) may be further decomposed into two pairs of constant-envelope vectors, such that the first pair sums to U and the second pair sums to V. The resulting four constant-envelope vectors are suitable for amplification using the non-linear amplifier elements 320 and the combining circuit 330 of FIG. 3.

As can be seen in FIG. 5, vectors U and V are in the same quadrant of the I-Q plane as vector S; for the formulation given above it can be shown that this will always be the case. Thus, the difference in phase between vectors U and V is always less than or equal to 90 degrees. In fact, for $\alpha=0$, the vectors U and V fall on the I and Q axes, respectively; thus the method pictured in FIG. 5 is identical to that pictured in FIG. 4 for $\alpha=0$. At the other extreme, if $\alpha=1$ then vectors U and V are identical, and each have the same phase as the input vector S. When vectors U and V are further decomposed into constant-envelope component vectors, the resulting vectors will also point in the same general direction as S. In an extreme case, i.e., at the maximum possible output amplitude for the transmitter circuit, all four constant-envelope vectors will have exactly the same phase. These vectors will add constructively—thus, if the maximum output amplitude of one power amplifier element is A, then the combined output may be as high as 4A, as compared to the 2A to $2\sqrt{2}A$ observed earlier. As a result, it is possible to achieve the maximum possible output power from the configuration pictured in FIG. 3.

Thus, in some embodiments of the invention, an input signal is decomposed into two pairs of constant-envelope vectors, such that the vector sum of the first pair is the I component of the input signal and the vector sum of the second pair is the Q component, for desired output signal amplitudes that are below a first level corresponding to a first pre-determined threshold. (The pre-determined threshold may be referenced to the output signal amplitude signal in some embodiments, or to the corresponding input signal amplitude in others.) For desired output signal amplitudes that are above this first level, the input signal is also decomposed into two pairs of constant-envelope vectors, but such that the vector sum of the first pair is separated by less than ninety degrees from the vector sum of the second pair. In some embodiments, for desired output signal amplitudes that are above a second level (e.g., corresponding to a second pre-determined threshold), which may be close to the maximum achievable output signal amplitude, the vector sums of the first and second pairs may have exactly the same phase. (In other words, the parameter $\alpha$ discussed above may have a value of 1 for desired output signal amplitudes above the second level.)

In any case, the two pairs of constant envelope signals are suitable to be converted to amplifier input signals (e.g., by the upconversion pictured in FIG. 3) and amplified by nonlinear amplifier components. The amplified signals may then be combined to yield an amplified output signal having the desired amplitude and phase variation, i.e., the same phase and amplitude variation as the input signal. Although the nonlinear amplifier elements will create distortion products at harmonics of the carrier frequencies, these may be filtered off. Other distortion may be minimized using conventional circuit design techniques.

Figure 6:
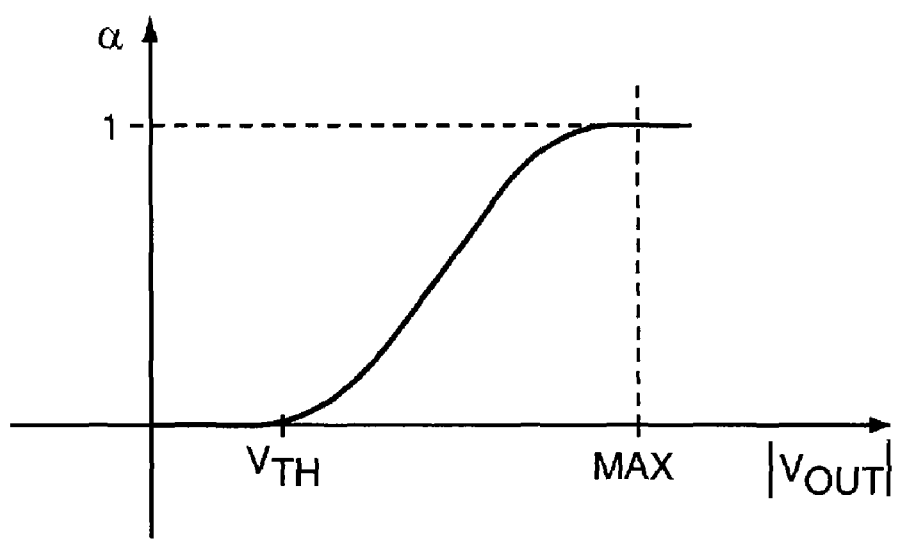
FIG. 6 illustrates an exemplary graph of a parameter function.

Bandwidth expansion is minimized by using the Cartesian decomposition approach for the smallest output signal levels. This is equivalent to making $\alpha=0$ for desired output levels below a first threshold level. To further minimize bandwidth expansion there should be a smooth transition between $\alpha=0$ at small output amplitudes and larger values for $\alpha$ at higher output amplitudes. To achieve the maximum possible output level for a given power amplifier configuration, $\alpha$ should be set to a value of 1 for large output signal amplitudes, e.g., output amplitudes above a second threshold level. An example of a suitable function for parameter α, as a function of the desired output signal amplitude $|V_{OUT}|$, is illustrated in FIG. 6. As pictured, the parameter α is equal to zero up to a first threshold level; this ensures that a purely Cartesian representation is used in a circle surrounding the origin. This eliminates the very fast signal transitions that may otherwise occur when generating and processing the constant-envelope vectors. Above the first threshold, the value of α rises smoothly, to a maximum value of 1. Those skilled in the art will appreciate that any of a variety of (preferably smooth) functions may be used; in some embodiments the maximum value for α may be less than 1. Furthermore, in practice, the function of FIG. 6 (or other function) may be implemented as a look-up table, so that the parameter value α is determined by retrieving a value from a look-up table indexed by a parameter corresponding to the desired output signal amplitude. In some cases, interpolation between look-up table values may be used to provide a smoother function.

Figure 7:
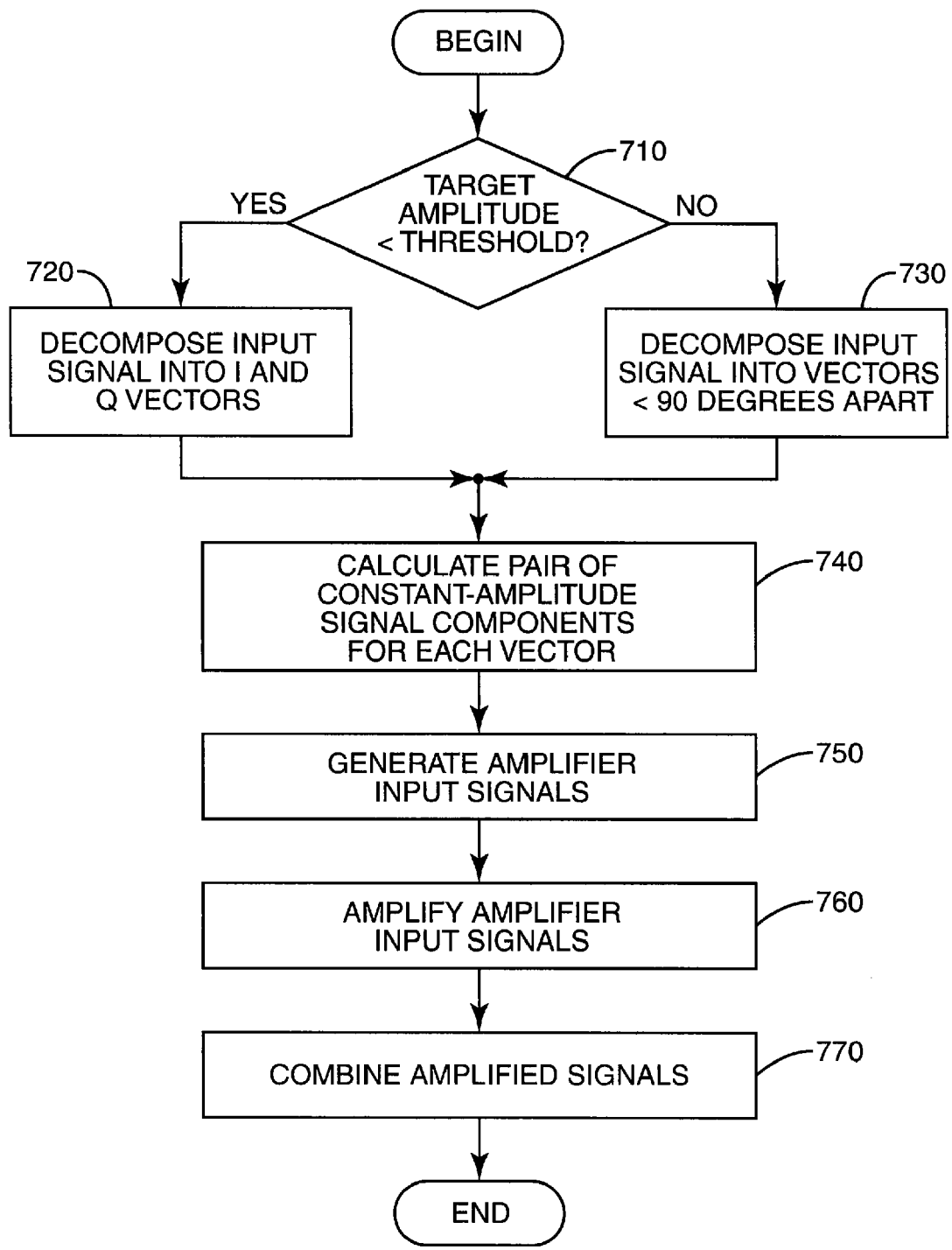
FIG. 7 is a logic flow diagram illustrating an exemplary method for processing an input information signal to obtain an amplified output signal according to some embodiments of the invention.

In view of the preceding description, an exemplary method for processing an input information signal of varying amplitude and phase to obtain an amplified output signal is pictured in the logic flow diagram of FIG. 7. The pictured method, and variations thereof, may be implemented using the transmitter circuit of FIG. 3. However, those skilled in the art will appreciate that the illustrated method may be implemented using a variety of other circuit configurations.

In any case, the method of FIG. 7 begins with a determination of whether the desired output signal amplitude is below a level corresponding to a pre-determined threshold, as shown at block 710. (In practice, this may comprise comparing a desired output signal amplitude to a threshold value, or, in some embodiments, comparing a corresponding input signal amplitude to a threshold value. For purposes of the following discussion, the former approach is generally assumed.) Those skilled in the art will recognize that the desired output signal amplitude is a function of both a targeted average output power level and the magnitude of the amplitude component of the desired modulation at a given instant in time. Thus, the modulation scheme itself may require a first dynamic range; perhaps 20 dB. Power level adjustment, e.g., to minimize interference with other signals, may require an additional dynamic range, perhaps as high as 70 dB. At low average output power levels, the desired output signal amplitude may remain below the threshold level for all levels of the modulation scheme. In this case, the input signal is decomposed into orthogonal signal components (e.g., I and Q components), as shown at block 720. At high average output power levels, however, the amplitude modulation component of the signal may cause the desired output signal amplitude to range above and below the threshold level over time. In these cases, then, the input signal constant-envelope signal is sometimes decomposed into orthogonal components, as shown at block 720, and at other times is decomposed into two vectors separated in phase by less than 90 degrees, as shown at block 730.

At block 740, a pair of constant-amplitude signal components is calculated for each of the two vectors obtained in block 720 or block 730, so that the vector sum of each pair is equal to (or proportional to) the respective vector. Those skilled in the art will appreciate that the calculation of block 740 may be combined with the respective decompositions of block 720 and block 730. Thus, in some embodiments, a single calculation process may be implemented to determine the constant-envelope signals; the intermediate vectors might not be expressly calculated.

In any event, at block 750, the constant-envelope signal components of block 740 are used to generate amplifier input signals. In some embodiments, such as the transmitter circuit of FIG. 3, the decomposition of an input information signal may be performed at baseband, using a digital signal processor. In such embodiments, the baseband constant-envelope signal vectors are upconverted to the desired carrier frequency, using quadrature modulators, to generate the amplifier input signals. The amplifier input signals are then amplified, as shown at block 760, using a switched-mode power amplifier for each signal. The amplified signals are then combined, as shown at block 770, for transmission. The vectors of constant length have no amplitude modulation, and are therefore very well suited to be amplified by non-linear switched-mode power amplifiers, which have the potential for achieving very high efficiency.

Figure 8:
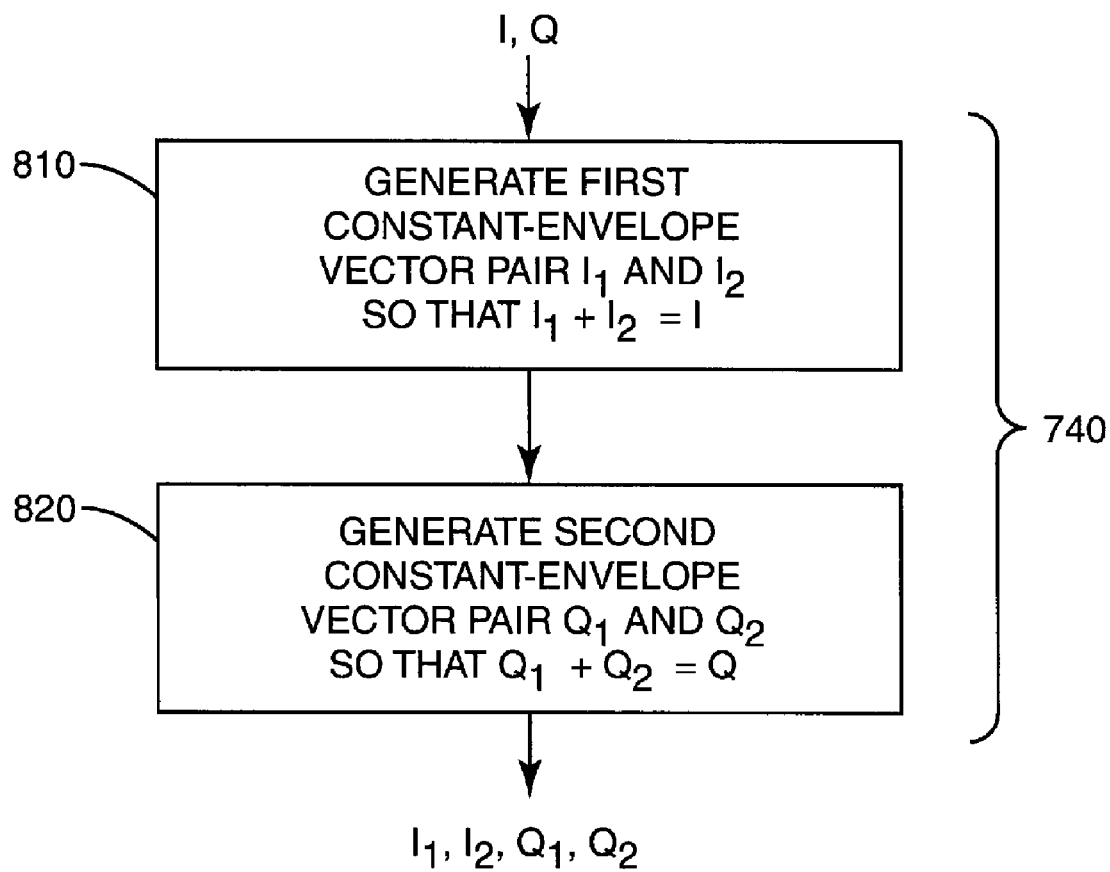
FIG. 8 is another logic flow diagram illustrating the generation of two constant-envelope vector pairs according to some embodiments of the invention.

FIG. 8 provides exemplary details for the calculation of constant-amplitude signal components at block 740, for the case when the desired output signal amplitude is relatively small, i.e., when the construction of the constant-amplitude signal components is based on a Cartesian decomposition of the input information signal. In FIG. 8, block 810 is supplied with the time-varying I and Q components of the input information signal, I(t) and Q(t). These time-varying components may in some instances be selected digital samples of the input information signal corresponding to desired output signal amplitudes below a level corresponding to a pre-determined threshold. In any event, at block 810, a first pair of constant-envelope vectors $I_1(t)$ and $I_2(t)$ are constructed, so that $I_1(t)+I_2(t)=I(t)$. If the constant-envelope components have amplitude A, then:

$$I_1(t)=A\angle\phi_I(t)$$

$$I_2(t)=A\angle-\phi_I(t),$$

$$\phi_I(t)=\cos^{-1}[I(t)/2A] \quad (1)$$

where $|I(t)|\leq 2A$. Similarly, at block 820, a second pair of constant-envelope vectors $Q_1(t)$ and $Q_2(t)$ are constructed, so that $Q_1(t)+Q_2(t)=Q(t)$. Given that the constant-envelope components have amplitude A, then:

$$Q_1(t) = A\angle\left(\phi_Q(t) + \frac{\pi}{2}\right) \quad (2)$$

$$Q_2(t) = A\angle\left(-\phi_Q(t) + \frac{\pi}{2}\right),$$

$$\phi_Q(t) = \cos^{-1}[Q(t)/2A]$$

where $|Q(t)|\leq 2A$. In practice, the arccosine function may be implemented using a lookup table. Interpolation may be used in some embodiments to reduce the size of the look-up table while maintaining a relatively smooth function.

Figure 9:
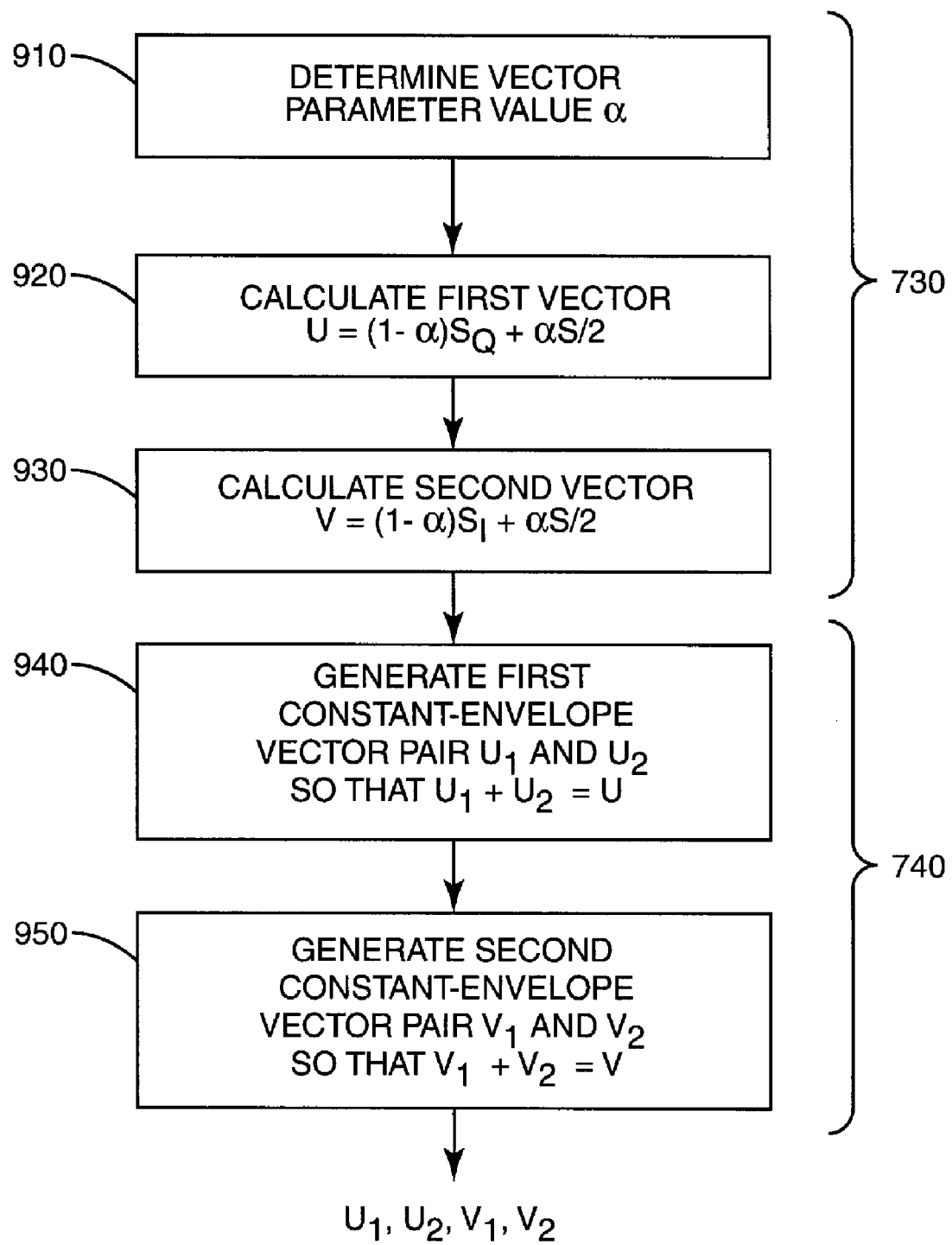
FIG. 9 is another logic flow diagram illustrating the generation of two constant-envelope vector pairs according to some embodiments of the invention

FIG. 9 provides exemplary details for the calculation of constant-signal components for the case when the desired output signal amplitude is relatively large. The pictured blocks 910, 920, and 930 may be substituted, in some embodiments of the invention, for block 730 of FIG. 7. Likewise, blocks 940 and 950 may be substituted, in some embodiments, for block 740.

In any event, the calculation of constant-envelope signal components in FIG. 9 begins with the determination of a parameter α, at block 910, based on the desired output signal amplitude. In the discussion above, as well as in the following discussion, the value of α is limited to a range of zero to one. However, those skilled in the art will recognize that alternative formulations for the following expressions are possible, in which case the parameter may have a different range. Those skilled in the art will also appreciate that a may be calculated from the desired output signal amplitude, in some implementations, or retrieved from a lookup table stored in memory in other embodiments.

In any case, the method of FIG. 9 continues at block 920 and 930, with the calculation of first and second vectors U(t) and V(t), based on the parameter α and the input information signal S(t). In some cases, discrete-time values for first and second vectors U(t) and V(t) may be calculated only for samples of S(t) corresponding to desired output signal amplitudes above a level corresponding to a pre-determined threshold. In any case, in some embodiments U(t) and V(t) may be constructed according to:

$$U(t) = (1-\alpha)S_Q(t) + \frac{\alpha}{2}S(t)$$
$$V(t) = (1-\alpha)S_I(t) + \frac{\alpha}{2}S(t)$$ (3)

where $S_I(t)$ and $S_Q(t)$ are the projections of S(t) onto the I and Q axes, respectively, of the I-Q plane. In embodiments employing this formulation, U(t)+V(t)=S(t); in other embodiments, the vector sum of U(t) and V(t) may be proportional to the input information signal.

At blocks 940 and 950, vectors U(t) and V(t) are further decomposed into constant-envelope vector pairs $U_1$, $U_2$ and $V_1$, $V_2$, so that $U_1(t)+U_2(t)=U(t)$ and $V_1(t)+V_2(t)=V(t)$:

$$U_1(t)=A\angle[\phi_U(t)+arg(U(t))]$$

$$U_2(t)=A\angle[-\phi_U(t)+arg(U(t))],$$

$$\phi_U(t)=\cos^{-1}[|U(t)|/2A]$$ (4)

and $$V_1(t)=A\angle[\phi_V(t)+arg(V(t))]$$

$$V_2(t)=A\angle[-\phi_V(t)+arg(V(t))].$$

$$\phi_V(t)=\cos^{-1}[|V(t)|/2A]$$ (5)

As was discussed above, the constant-envelope component signals may be used to generate amplifier input signals suitable for amplification with non-linear amplifier elements. In FIG. 3, constant-envelope component signals are upconverted to a desired carrier signal frequency using quadrature modulators, and each of the upconverted signals are separately amplified. Another approach is to up-convert the two pairs of constant-envelope signal components, feeding each pair to digital logic configured to create a pulse-width modulated (PWM) signal for each pair. In some embodiments, it may be necessary to process the pulse-width modulated signal in a limiting amplifier to sharpen the edges. The two pulse-width modulated signals are then each fed to separate switched-mode power amplifiers capable of handling signals with varying duty cycle, such as voltage-mode class-D power amplifiers. With this approach, just two power amplifiers are needed, and the combination of the amplified signals is simplified.

Figure 10:
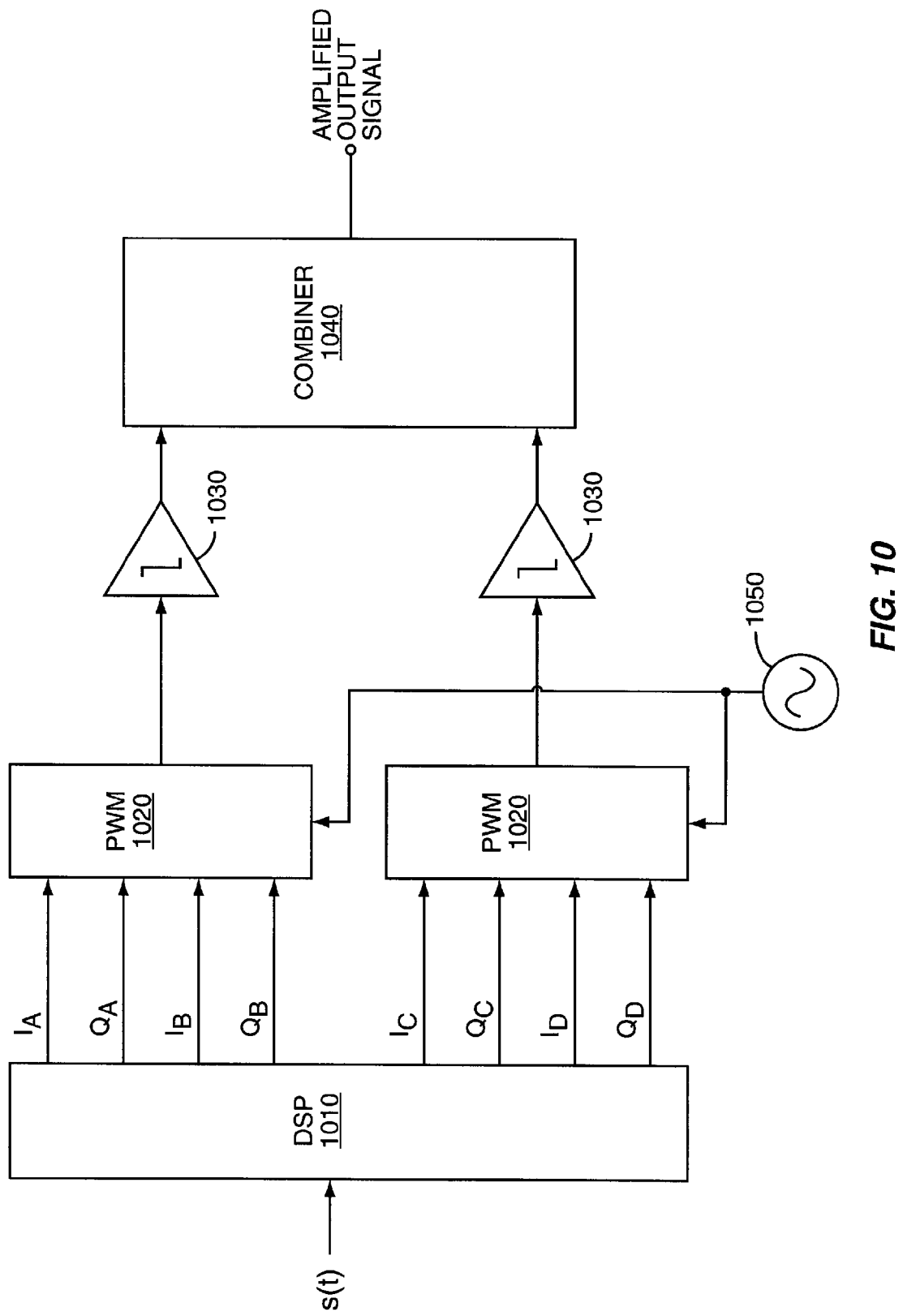
FIG. 10 illustrates another exemplary transmitter circuit.

This approach is pictured in FIG. 10, where the input information signal s(t) is decomposed into two-pairs of constant-envelope component signals by DSP 1010. Each component signal is represented in FIG. 10 in quadrature form; thus a first constant-envelope signal component is represented by $I_A$ and $Q_A$. Those skilled in the art will appreciate that other representations are possible. In any event, each pair is fed into a pulse-width modulator (PWM) circuit 1020, clocked by a carrier-frequency signal from oscillator 1050. The output of each PWM 1020 is amplified by switched-mode power amplifier elements 1030; the amplified signals are combined in combiner 1040 to obtain the amplified output signal.

The above-described methods and transmitter circuits, and variants thereof, may be embodied in any of a number of wireless devices, such as a base station or mobile terminal. Those skilled in the art will appreciate that various circuits discussed herein, including but not limited to digital signal processor circuits 340 and 1010, may be implemented using one or more microprocessors, microcontrollers, digital signal processors, and/or customized hardware, and may be implemented as one or more standalone chips or as part of an application-specific integrated circuit (ASIC) that includes other functions. In some embodiments, these circuits may comprise one or more programmable elements, programmed using software, firmware, or some combination of the two. The signal processing circuits may also include one or more elements that are hardwired to carry out one or more of the methods described herein.

The present invention may be carried out in other ways than those specifically set forth herein without departing from essential characteristics of the invention. The present embodiments are to be considered in all respects as illustrative and not restrictive, and all changes coming with the meaning and equivalency range of the appended claims are intended to be embraced within.

What is claimed is:

1. A method of processing an input information signal of varying amplitude and phase to obtain an amplified output signal, the method comprising:
   for desired output signal amplitudes below a first level corresponding to a first pre-determined threshold, decomposing the input information signal into two pairs of constant-envelope component signals such that the vector sum of the first pair of component signals is orthogonal to the vector sum of the second pair of component signals;
   for desired output signal amplitudes above the first level, decomposing the input information signal into two pairs of constant-envelope component signals such that the vector sum of the first pair of component signals is separated by less than ninety degrees from the vector sum of the second pair of component signals;
   generating a plurality of amplifier input signals from the constant-envelope component signals;
   amplifying each amplifier input signal with a separate amplifier element; and
   combining the amplified signals to obtain the output signal.

2. The method of claim 1, wherein the vector sum of the component signals is substantially equal to the input information signal.

3. The method of claim 1, wherein the vector sum of the component signals is proportional to the input information signal and is at a constant phase offset from the input information signal.

4. The method of claim 1, wherein decomposing the input information signal into two pairs of constant-envelope component signals comprises, for a desired output signal amplitude equal to or above a second level corresponding to a second pre-determined threshold, generating the component signals such that the vector sums of each pair of component signals have the same phase.

5. The method of claim 1, wherein the separate amplifier elements have substantially identical gain and phase characteristics.

6. The method of claim 1, wherein decomposing the input information signal into two pairs of constant-envelope component signals for desired output signal amplitudes below the first level comprises:
- determining an in-phase component and a quadrature component for the input information signal;
- generating the first pair of constant-envelope component signals such that the vector sum of the first pair of component signals is substantially equal to the in-phase component; and
- generating the second pair of constant-envelope component signals such that the vector sum of the second pair of component signals is substantially equal to the in-phase component.

7. The method of claim 1, further comprising determining a parameter value, $\alpha$, as a function of the desired output signal amplitude, wherein decomposing the input information signal into two pairs of constant-envelope component signals for desired output signal amplitudes above the first level comprises:
- generating the first pair of constant-envelope component signals such that the vector sum of the first pair of component signals is proportional to $$(1-\alpha)S_I(t) + \frac{\alpha}{2}S(t),$$

where S(t) is the time-varying input signal and $S_I(t)$ is the projection of S(t) onto a first axis of a Cartesian coordinate plane; and
- generating the second pair of constant-envelope component signals such that the vector sum of the second pair of component signals is proportional to $$(1-\alpha)S_Q(t) + \frac{\alpha}{2}S(t),$$

where $S_Q(t)$ is the projection of S(t) onto a second axis, orthogonal to the first axis, of the Cartesian coordinate plane.

8. The method of claim 7, wherein determining the parameter value comprises retrieving the parameter value from a look-up table indexed by an index parameter corresponding to the desired output signal amplitude.

9. The method of claim 8, wherein determining the parameter value further comprises interpolating between entries in the look-up table.

10. The method of claim 1, wherein the constant-envelope component signals are at a baseband frequency or an intermediate frequency, and wherein generating a plurality of amplifier input signals from the constant-envelope component signals comprises upconverting each of the constant-envelope component signals to an amplifier input signal at the output signal frequency.

11. The method of claim 1, wherein generating a plurality of amplifier input signals from the constant-envelope component signals comprises generating a pulse-width modulated amplifier input signal from each pair of constant-envelope component signals.

12. A transmitter circuit for processing an input information signal of varying amplitude and phase to obtain an amplified output signal, the transmitter circuit comprising:
- a signal processing circuit configured to decompose the input information signal into two pairs of constant-envelope component signals so that the sum of the first pair of component signals is orthogonal to the sum of the second pair of component signals for desired output signal amplitudes below a first level corresponding to a first pre-determined threshold and the sum of the first pair of component signals is separated by less than ninety degrees from the sum of the second pair of component signals for desired output signal amplitudes above the first level;
- a generator circuit configured to generate a plurality of amplifier input signals from the constant-envelope component signals;
- an amplifier element for each amplifier input signal, each amplifier element configured to amplify a respective one of the amplifier input signals; and
- a combining circuit configured to combine the amplified signals to obtain the output signal.

13. The transmitter circuit of claim 12, wherein the vector sum of the component signals is substantially equal to the input information signal.

14. The transmitter circuit of claim 12, wherein the vector sum of the component signals is proportional to the input information signal and is at a constant phase offset from the input information signal.

15. The transmitter circuit of claim 12, wherein the signal processing circuit is configured to decompose the input information signal into two pairs of constant-envelope component signals for a desired output signal amplitude equal to or above a level corresponding to a second pre-determined threshold by generating the component signals such that the vector sums of each pair of component signals have the same phase.

16. The transmitter circuit of claim 12, wherein the amplifier elements have substantially identical gain and phase characteristics.

17. The transmitter circuit of claim 12, wherein the signal processing circuit is configured to decompose the input information signal into two pairs of constant-envelope component signals for desired output signal amplitudes below the first level by:
- determining an in-phase component and a quadrature component for the input information signal;
- generating the first pair of constant-envelope component signals such that the vector sum of the first pair of component signals is substantially equal to the in-phase component; and
- generating the second pair of constant-envelope component signals such that the vector sum of the second pair of component signals is substantially equal to the quadrature component.

18. The transmitter circuit of claim 12, wherein the signal processing circuit is further configured to determine a parameter value, $\alpha$, as a function of the desired output signal amplitude, and to decompose the input information signal into two pairs of constant-envelope component signals for desired output signal amplitudes above the first level by:
- generating the first pair of constant-envelope component signals such that the vector sum of the first pair of component signals is proportional to $$(1-\alpha)S_I(t) + \frac{\alpha}{2}S(t),$$

where S(t) is the time-varying input signal and $S_I(t)$ is the projection of S(t) onto a first axis of a Cartesian coordinate plane; and generating the second pair of constant-envelope component signals such that the vector sum of the second pair of component signals is proportional to $$(1-\alpha)S_Q(t) + \frac{\alpha}{2}S(t),$$

where $S_Q(t)$ is the projection of S(t) onto a second axis, orthogonal to the first axis, of the Cartesian coordinate plane.

19. The transmitter circuit of claim 18, wherein the signal processing circuit is configured to determine the parameter value by retrieving the parameter value from a look-up table indexed by an index parameter corresponding to the desired output signal amplitude.

20. The transmitter circuit of claim 19, wherein the signal processing circuit is further configured to determine the parameter value by interpolating between entries in the look-up table.

21. The transmitter circuit of claim 12, wherein the signal processing circuit is configured to generate the constant-envelope component signals at a baseband or intermediate frequency, and wherein the generator circuit comprises an upconverter circuit configured to upconvert each of the constant-envelope component signals to an output signal frequency prior to amplification by the amplifier elements.

22. The transmitter circuit of claim 12, wherein the generator circuit comprises a pulse-width modulator circuit configured to generate a pulse-width modulated amplifier input signal from each pair of constant-envelope component signals.

* * * * *

UNITED STATES PATENT AND TRADEMARK OFFICE
CERTIFICATE OF CORRECTION

PATENT NO. : 7,957,712 B2  Page 1 of 1
APPLICATION NO. : 12/139813
DATED : June 7, 2011
INVENTOR(S) : Sjoland It is certified that error appears in the above-identified patent and that said Letters Patent is hereby corrected as shown below:

In Fig. 5, Sheet 4 of 8, delete " $S_I$ " and insert -- $S_f$ --, therefor.

In Column 5, Line 67, delete "(sin [ω])." and insert -- (sin [ωt]). --, therefor.

In Column 7, Line 58, delete " $U = (1-\alpha)S_U(t) + \frac{\alpha}{2}S$, " and insert -- $U = (1-\alpha)S_Q + \frac{\alpha}{2}S$, --, therefor.

Signed and Sealed this
Thirteenth Day of March, 2012

David J. Kappos
*Director of the United States Patent and Trademark Office*